United States Patent
Joshi

(10) Patent No.: US 11,098,960 B2
(45) Date of Patent: Aug. 24, 2021

(54) COOLING DEVICES INCLUDING A VARIABLE ANGLE CONTACT SURFACE AND METHODS FOR COOLING HEAT-GENERATING DEVICES WITH A COOLING DEVICE

(71) Applicant: Toyota Motor Engineering & Manufacturing North America, Inc., Plano, TX (US)

(72) Inventor: Shailesh N. Joshi, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 167 days.

(21) Appl. No.: 16/208,819

(22) Filed: Dec. 4, 2018

(65) Prior Publication Data
US 2020/0173733 A1    Jun. 4, 2020

(51) Int. Cl.
| | |
|---|---|
| F28D 15/00 | (2006.01) |
| F28D 15/04 | (2006.01) |
| C09K 5/04 | (2006.01) |
| H01L 23/373 | (2006.01) |
| H01L 23/22 | (2006.01) |
| H01L 23/31 | (2006.01) |

(Continued)

(52) U.S. Cl.
CPC ............ *F28D 15/046* (2013.01); *C09K 5/048* (2013.01); *H01L 23/22* (2013.01); *H01L 23/31* (2013.01); *H01L 23/367* (2013.01); *H01L 23/373* (2013.01); *F28F 2255/20* (2013.01); *F28F 2260/02* (2013.01); *H01L 23/4275* (2013.01); *H01L 24/29* (2013.01); *H01L 24/33* (2013.01); *H01L 24/83* (2013.01)

(58) Field of Classification Search
CPC ....... F28D 15/046; C09K 5/048; H01L 23/22; H01L 23/31; H01L 23/367; H01L 23/373; H01L 23/4275; H01L 24/29; H01L 24/33; H01L 24/83; F28F 2255/20; F28F 2260/02
USPC ..................................................... 165/104.21
See application file for complete search history.

(56) References Cited

U.S. PATENT DOCUMENTS

| 8,434,225 B2 | 5/2013 | Mahefkey et al. |
| 8,967,236 B2 * | 3/2015 | Catton .................. C09K 5/048 |
| | | 165/104.26 |

(Continued)

FOREIGN PATENT DOCUMENTS

| CN | 106102414 A | 11/2016 |
| CN | 105716467 | 11/2017 |

OTHER PUBLICATIONS

Chenzhen Ji, et at., "Non-Uniform Heat Transfer Suppression to Enhance PCM Melting by Angled Fins", https://www.researchgate.net/publication/320371476; Published: Oct. 7, 2017 Journal: Applied Thermal Engineering.

*Primary Examiner* — Henry T Crenshaw
*Assistant Examiner* — Kamran Tavakoldavani
(74) *Attorney, Agent, or Firm* — Dinsmore & Shohl, LLP

(57) ABSTRACT

A cooling device includes a substrate defining a substrate upper surface, and a fin positioned on the substrate upper surface, the fin including a deformable encapsulating layer coupled to the substrate upper surface and defining an interior region, and a phase-change material encapsulated within the interior region, where the phase-change material changes from a first matter phase to a second matter phase at a boiling point of a working fluid positioned on the deformable encapsulating layer.

20 Claims, 3 Drawing Sheets

(51) Int. Cl.
*H01L 23/367* (2006.01)
*H01L 23/427* (2006.01)
*H01L 23/00* (2006.01)

(56) References Cited

U.S. PATENT DOCUMENTS

| | | | |
|---|---|---|---|
| 2009/0301691 A1* | 12/2009 | Mohapatra | F28D 19/04 |
| | | | 165/104.17 |
| 2012/0052241 A1 | 3/2012 | King et al. | |
| 2013/0075076 A1* | 3/2013 | Agostini | H05K 7/20945 |
| | | | 165/287 |
| 2017/0333941 A1* | 11/2017 | Park | F28F 13/187 |
| 2018/0138387 A1* | 5/2018 | Wong | F28D 20/02 |

* cited by examiner

US 11,098,960 B2

COOLING DEVICES INCLUDING A VARIABLE ANGLE CONTACT SURFACE AND METHODS FOR COOLING HEAT-GENERATING DEVICES WITH A COOLING DEVICE

FIELD

The present specification generally relates to methods and apparatuses for cooling heat-generating devices and, more specifically, to cooling devices including a variable angle contact surface.

TECHNICAL BACKGROUND

Cooling devices may be coupled to a heat-generating device, such as a power electronics device, to remove heat and lower the operating temperature of the heat-generating device. Working fluid may be used to receive heat generated by the heat-generating device by convective and/or conductive thermal transfer, and may remove such heat from the heat-generating device.

However, as power electronics are designed to operate at increased power levels and generate increased corresponding heat flux due to the demands of newly developed electrical systems, conventional cooling devices are unable to adequately remove the heat flux to effectively lower the operating temperature of the power electronics to acceptable temperature levels.

Accordingly, a need exists for alternative cooling devices and methods for operating cooling devices.

SUMMARY

In one embodiment, a cooling device includes a substrate defining a substrate upper surface, and a fin positioned on the substrate upper surface, the fin including a deformable encapsulating layer coupled to the substrate upper surface and defining an interior region, and a phase-change material encapsulated within the interior region, where the phase-change material changes from a first matter phase to a second matter phase at a boiling point of a working fluid positioned on the deformable encapsulating layer.

In another embodiment, a cooling system includes a cooling device including a substrate defining a substrate upper surface, a plurality of fins positioned on the substrate upper surface, each of the plurality of fins including a deformable encapsulating layer coupled to the substrate upper surface, where the deformable encapsulating layer is repositionable between a static position, in which the deformable encapsulating layer is oriented to face upwards in a vertical direction, and a dynamic position, in which the deformable encapsulating layer defines at least one cavity extending inward and toward the substrate upper surface and at least one peak extending outward and away from the substrate upper surface, and a working fluid positioned on encapsulating layer, where the working fluid includes a boiling point and the deformable encapsulating layer transitions from the static position to the dynamic position at the boiling point of the working fluid.

In yet another embodiment, a method for cooling a heat-generating device includes heating a substrate lower surface of a substrate with a heat-generating device, transferring thermal energy from the substrate lower surface, through the substrate to a substrate upper surface positioned opposite the substrate lower surface, heating an encapsulated phase-change material positioned on the substrate upper surface, changing a matter phase of the encapsulated phase-change material, heating a working fluid positioned on the encapsulated phase-change material, and boiling the working fluid while changing the matter phase of the encapsulated phase-change material.

Additional features of the cooling devices and methods for cooling a heat-generating device with a cooling device described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
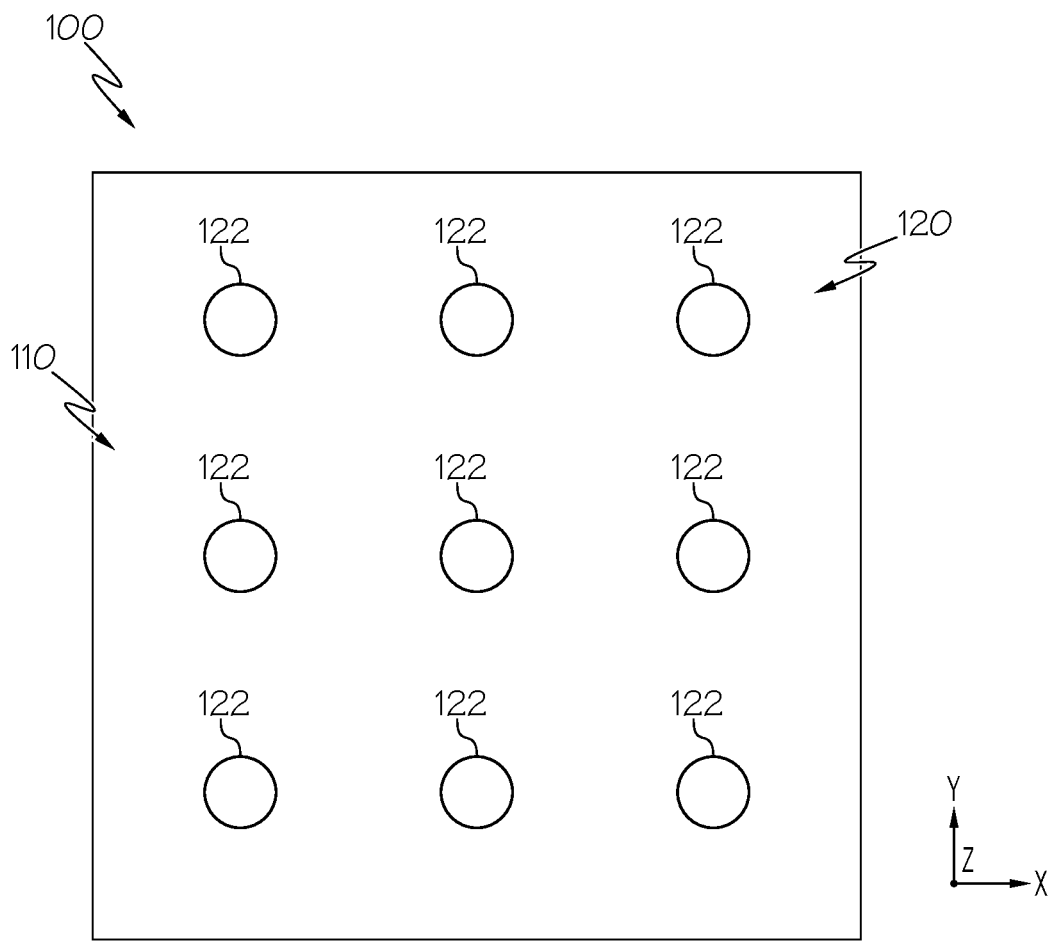
FIG. 1 schematically depicts a top view of a cooling device, according to one or more embodiments shown and described herein.

Reference will now be made in detail to embodiments of cooling devices coupled to a heat-generating device. A working fluid may be engaged with the cooling device, and the working fluid may be selected and configured to boil as thermal energy is transferred from the cooling device to the working fluid. In some embodiments, the working fluid may utilized in passive or active cooling systems, and may be positioned, for example, within a vapor chamber, a heat pipe, a two-phase cooling system, a forced liquid cooling system, or the like. In some configurations, the operating temperature of the heat-generating device, and accordingly a temperature of the cooling device, may be significantly higher than the boiling point of the working fluid. In these instances, working fluid in contact with the cooling device may vaporize instantaneously or near instantaneously, such that some portions of the cooling device are not in contact with the working fluid. At portions where the working fluid is not in contact with the cooling device, localized temperatures of the cooling device and the heat-generating device may increase, and the overall amount of heat dissipated from the heat-generating device may decrease. In these configurations, the temperature of the heat-generating device may exceed acceptable operating parameters, leading to decreased performance of the heat-generating device and/or failure of the heat-generating device.

Cooling devices according to embodiments described herein are engaged with a heat-generating device and include fins positioned on a substrate upper surface. The fins generally include a phase-change material encapsulated on the substrate upper surface by a deformable encapsulating layer. In embodiments, the phase-change material is configured and selected to have a melting point that corresponds to the boiling point of the working fluid engaged with the substrate upper surface. As the phase-change material melts, the phase-change material expands and dynamically changes the contour of the deformable encapsulating layer, forming nucleation cavities and peaks on the deformable encapsulating layer. By dynamically changing the contour of the deformable encapsulating layer, the phase-change material may assist in maintaining contact with the working fluid as the working fluid boils. Furthermore, the peaks and nucleation cavities formed on the deformable encapsulating layer create a variable contact surface with the working fluid, which may assist in inducing boiling within the working fluid and thereby increasing an amount of thermal energy dissipated by the cooling device. Moreover, the phase-change material of the cooling device may assist in dissipating thermal energy as the phase-change material changes from one matter phase to another. Various embodiments of cooling devices and methods for operating the same will be described herein with specific reference to the appended drawings.

As used herein, the term "longitudinal direction" refers to the forward-rearward direction of the cooling device (i.e., in the +/−X-direction as depicted). The term "lateral direction" refers to the cross-direction of the cooling device (i.e., in the +/−Y-direction as depicted), and is transverse to the longitudinal direction. The term "vertical direction" refers to the upward-downward direction of the cooling device (i.e., in the +/−Z-direction as depicted), and is transverse to the lateral and the longitudinal directions.

As used herein, the terms "boiling point" and "melting point" refer to a temperature at which materials referenced herein transition from a liquid phase to a gaseous phase and transition from a solid phase to a liquid phase, respectively. It should be understood that the materials referenced herein may be maintained at suitable pressures to obtain the desired boiling points and melting points.

Figure 2:
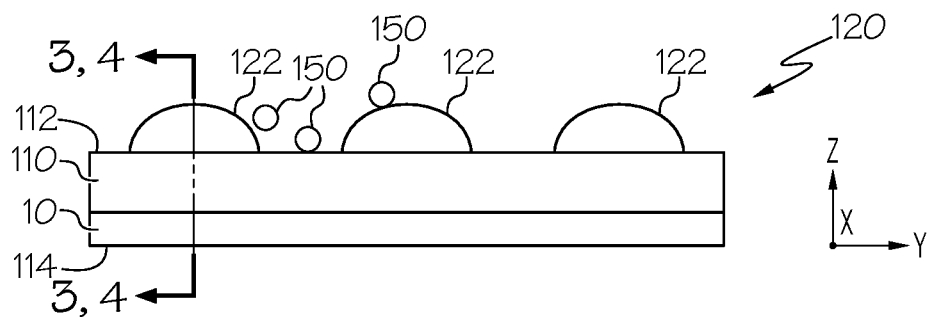
FIG. 2 schematically depicts a side view of the cooling device of FIG. 1 engaged with a heat-generating device, according to one or more embodiments shown and described herein.

Referring initially to FIGS. 1 and 2, a top view and a side view of an example cooling device 100 are schematically depicted, respectively. The cooling device 100 generally includes a substrate 110 and a plurality of fins 120 positioned on the substrate 110. The plurality of fins 120 includes individual fins 122 that are spaced apart from one another in the lateral and the longitudinal directions. In the embodiment depicted in FIGS. 1 and 2, each of the fins 122 are regularly spaced apart from one another, however, the fins 122 may be positioned on the substrate 110 at any suitable spacing from one another. In the embodiment depicted in FIGS. 1 and 2, the substrate 110 generally defines a rectangular prism, however, it should be understood that the substrate 110 may have any suitable shape. Similarly, in the embodiment depicted in FIGS. 1 and 2, the fins 122 each define a semi-spherical shape, however the fins 122 may include any suitable shape.

Referring particularly to FIG. 2, the substrate 110 generally defines a substrate upper surface 112 and a substrate lower surface 114 positioned opposite the substrate upper surface 112 in the vertical direction. In embodiments, the plurality of fins 120 is positioned on the substrate upper surface 112, and a heat-generating device 10 is engaged with the substrate lower surface 114 opposite the plurality of fins 120. In embodiments, the substrate 110 may be formed of a thermally conductive material that receives and dissipates heat from the heat-generating device 10. For example and without limitation, the substrate 110 may be formed from aluminum, silver, gold, copper, or the like.

In some embodiments, the heat-generating device 10 may include a power electronics device engaged with the substrate lower surface 114. For example, the heat-generating device 10 may be one or more semiconductor devices that may include, without limitation, an insulated-gate bipolar transistor (IGBT), a reverse conducting IGBT (RC-IGBT), a metal-oxide-semiconductor field-effect transistor (MOSFET), a power MOSFET, diodes, transistors, and/or combinations thereof (e.g., power cards). In some embodiments, the heat-generating device 10 may include a wide-bandgap semiconductor, and may be formed from any suitable material, for example and without limitation diamond, silicon carbide (SiC), or the like.

In some embodiments, the heat-generating device 10 may be used in a vehicular electrical system, for example as part of an inverter system in an electric or hybrid-electric vehicle. In vehicular applications, the heat-generating device 10 may generate significant heat flux that should be dissipated to maintain the heat-generating device 10 at a suitable operating temperature. While the heat-generating device 10 is described herein is generally described as being utilized in a vehicular electrical system, it should be understood that the heat-generating device 10 may also be utilized in any other suitable application. Furthermore, while the heat-generating device 10 is described herein as including a power electronics device, it should be understood that the heat-generating device 10 may include any device that generates heat flux that should be dissipated.

Figure 3:
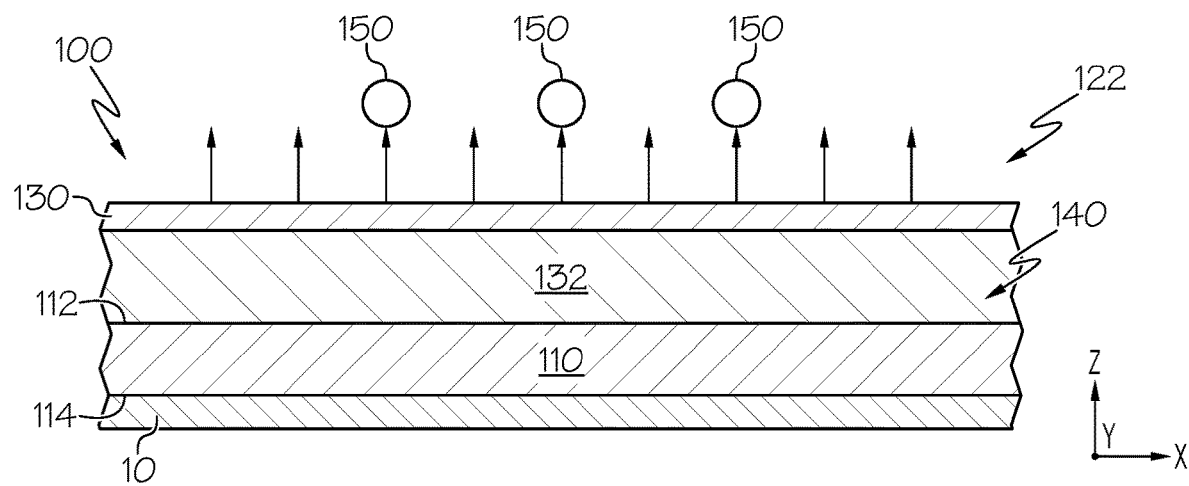
FIG. 3 schematically depicts a section view of the cooling device of FIG. 2 along section 3-3 of FIG. 2, according to one or more embodiments shown and described herein.

Referring to FIG. 3, a section view of one of the fins 122 is depicted along section 3-3 of FIG. 2. In embodiments, the fin 122 generally includes a deformable encapsulating layer 130 that defines an interior region 132, and an encapsulated phase-change material 140 positioned on the substrate upper surface 112 within the interior region 132. In embodiments, the deformable encapsulating layer 130 is coupled to the substrate upper surface 112, such that the deformable encapsulating layer 130 seals the encapsulated phase-change material 140 within the interior region 132. For example, in embodiments, the encapsulated phase-change material 140 may be hermetically sealed within the interior region 132 by the deformable encapsulating layer 130. As described and depicted herein, the encapsulated phase-change material 140 and the deformable encapsulating layer 130 are positioned on the substrate upper surface 112 at discrete locations to form the fins 122, however, it should be understood that in other embodiments, the encapsulated phase-change material 140 and the deformable encapsulating layer 130 may extend across all or substantially all of the substrate upper surface 112.

The deformable encapsulating layer 130 may be formed of a thermally conductive material that selectively deforms as the encapsulated phase-change material 140 changes between matter phases, as described in greater detail herein. For example, in some embodiments, the deformable encapsulating layer 130 may be formed from platinum, aluminum, or the like. In some embodiments, the deformable encapsulating layer 130 defines a thickness (e.g., evaluated in the vertical direction as depicted in FIG. 3) that is less than 100 nanometers. Because the deformable encapsulating layer 130 defines a relatively small thickness, when formed of a metal like platinum or aluminum, the deformable encapsulating layer 130 may elastically deform in the vertical direction as the encapsulated phase-change material 140 changes between matter phases, as described in greater detail herein. Furthermore, because the deformable encapsulating layer 130 includes a relatively small thickness, a thermal resistance of the deformable encapsulating layer 130 may be minimized, such that thermal energy may easily flow through the deformable encapsulating layer 130. In embodiments, the deformable encapsulating layer 130 may be formed on the substrate 110 through any suitable process, for example and without limitation, such as atomic layer deposition, chemical vapor deposition, or the like.

In embodiments, the phase-change material 140 generally includes a material that is configured to change phases under desired conditions. In some embodiments, the phase-change material 140 may include, without limitation, hydrated salt, polymer materials, molten salt, metal alloys, paraffin, carboxylic acid, ester, polyol, organic matter, crystal hydrated salt, high density polyethylene, or any suitable combination thereof. The phase-change material 140 may include a static state thickness (e.g., evaluated in the vertical direction at a point in which the phase-change material 140 is not transitioning between phases as depicted in FIG. 3) that is between 100 micrometers and 500 micrometers, inclusive of the endpoints. The static state thickness of the phase-change material 140 may be selected to optimize the thermal performance of the phase-change material 140. For example, the thickness of the phase-change material 140 may be selected to optimize the thermal energy that may be dissipated by the phase-change material 140 and the amount of thermal energy that may be absorbed by the phase-change material 140 as the phase-change material transitions between matter phases, as described in greater detail herein.

In embodiments, a working fluid 150 may be positioned on the fins 122 and the substrate 110 (FIG. 2). For illustrative purposes, the working fluid 150 is depicted as including discrete spherical structures, however, it should be understood that the working fluid 150 may include a fluid extending over all or nearly all of the substrate upper surface 112 and the fins 122. The working fluid 150 is configured to dissipate heat from the heat-generating device 10. For example, the heat-generating device 10 may heat the substrate lower surface 114, and thermal energy may be transferred from the substrate lower surface 114, through the substrate 110 to the substrate upper surface 112. The thermal energy may then heat the working fluid 150. For example, the thermal energy may be transmitted directly from the substrate upper surface 112 to the working fluid 150 at positions where the working fluid 150 positioned on the substrate upper surface 112, and the thermal energy may be transmitted to the working fluid 150 through the fins 122 at positions where the working fluid 150 is positioned on the fins 122. As the fins 122 extend above the substrate upper surface 112, the fins 122 may increase a surface area exposed to the working fluid 150, as compared to configurations that do not include the fins 122 positioned on the substrate upper surface 112. By increasing the surface area exposed to the working fluid 150, the cooling device 100 may increase the amount of thermal energy that may be dissipated from the heat-generating device 10.

The working fluid 150 may be selected and configured to boil at or below the operating temperature of the heat-generating device 10, and as the working fluid 150 is heated (either through contact with the substrate upper surface 112 or contact with the fins 122), the working fluid 150 may boil and change from a liquid phase to a gaseous phase. For example, the working fluid 150 may include a fluid comprising a chemical composition and maintained at a pressure such that the working fluid 150 has a boiling point at or below the operating temperature of the heat-generating device 10. In some embodiments, the working fluid 150 may include a water-based mixture, an ethylene glycol mixture, or the like. In some embodiments, the working fluid 150 may include a dielectric fluid.

Without being bound by theory, the re-arrangement of the structure of a material as the material changes to a higher phase (e.g. from a liquid phase to a gaseous phase) requires thermal energy, such that the material absorbs thermal energy from its surroundings when changing to the higher phase. Accordingly, as the working fluid 150 boils and changes from the liquid phase to the gaseous phase, the working fluid 150 may absorb thermal energy from the substrate 110 and the fins 122 positioned on the substrate 110. In this way, thermal energy generated by the heat-generating device 10 may be dissipated by the working fluid 150 via contact with the substrate 110.

Subsequent to boiling, the working fluid 150 may be directed away from the substrate 110, for example via a manifold or the like, may be condensed back to a liquid phase, and the working fluid 150 may be directed back toward the substrate 110. For example, in some embodiments, the working fluid 150 on the substrate 110 may be incorporated within a thermodynamic cycle. For example, in some embodiments the working fluid 150 may be incorporated within a vapor chamber, a heat pipe, or the like.

In some configurations, the operating temperature of the heat-generating device 10 may be high enough that as thermal energy passes through the substrate 110, the working fluid 150 in contact with the substrate 110 may vaporize instantaneously or near instantaneously. Instantaneous vaporization of the working fluid 150 may result in cavitation, such that portions of the substrate upper surface 112 may not contact the working fluid 150. Extended lack of contact between the working fluid 150 and the substrate upper surface 112 may reduce the amount of thermal energy transferred from the heat-generating device 10 to the working fluid 150. The reduction in dissipated heat from the heat-generating device 10 may in some instances lead the temperature of the heat-generating device 10 to exceed acceptable operating parameters.

In embodiments, the phase-change material 140 may assist in maintaining contact between the fins 122 and the working fluid 150. For example and referring to FIGS. 3 and 4, the phase-change material 140 may be selected such that the phase-change material 140 within the interior region 132 transitions between a first matter phase (e.g. a solid phase) to a second matter phase (e.g. a liquid phase) at or around a temperature that corresponds to the boiling point of the working fluid 150. In other embodiments, the phase-change material 140 may boil at or around a temperature that corresponds to the boiling point of the working fluid 150, transitioning between the first matter phase (e.g., a liquid phase) to the second matter phase (e.g., a gaseous phase). However and without being bound by theory, materials in a gaseous phase may be less thermally conductive than the same materials in a liquid phase and/or a solid phase. Accordingly, to maintain desirable thermal conductivity of the phase-change material 140, it may be beneficial to select the phase-change material 140 to have a melting point that corresponds to the boiling point of the working fluid 150, as compared to selecting the phase-change material 140 to have a boiling point that corresponds to the boiling point of the working fluid 150.

For example, in some embodiments, the phase-change material 140 has a melting point that corresponds to the boiling point of the working fluid 150. In embodiments in which the phase-change material 140 is selected to have a melting point that corresponds to the boiling point of the working fluid 150, the phase-change material 140 transitions from a solid phase to a liquid phase at or around the boiling point of the working fluid 150. In some embodiments, the phase-change material 140 may be configured and selected to have a melting point that is within 5 degrees Celsius of the boiling point of the working fluid 150. In embodiments in which the phase-change material 140 has a melting point that corresponds to the boiling point of the working fluid 150, the phase-change material 140 generally expands as it changes from the solid phase to the liquid phase.

Figure 4:
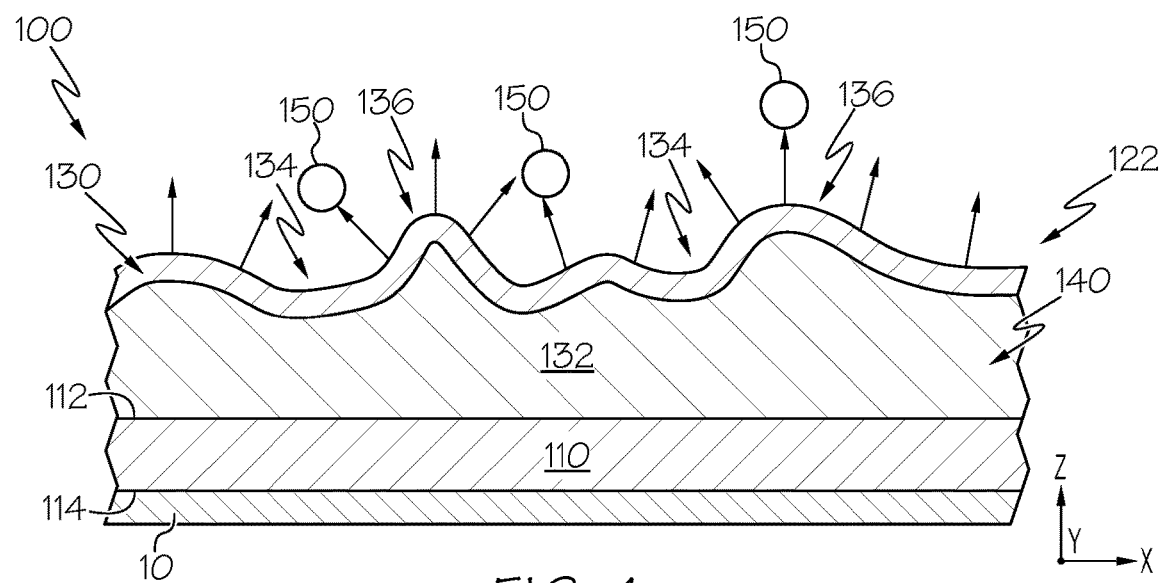
FIG. 4 schematically depicts a section view of the cooling device of FIG. 2 along section 4-4 of FIG. 2 with a phase-change material undergoing a phase change, according to one or more embodiments shown and described herein.

When the phase-change material 140 is at its melting point, the phase-change material 140 expands in the vertical direction, as depicted in FIG. 4. As the phase-change material 140 expands, the deformable encapsulating layer 130 generally expands along with the phase-change material 140. As noted above, the deformable encapsulating layer 130 may be elastically deformable, and the deformable encapsulating layer 130 may generally deform to accommodate the expansion of the phase-change material 140.

As depicted in FIG. 4, when the phase-change material 140 melts, the expansion of the phase-change material 140 may not be uniform, and portions of the phase-change material 140 may expand at different rates. As portions of the phase-change material 140 expand at different rates, the phase-change material 140 may form at least one peak 136 extending outward and away from the substrate upper surface 112, and at least one nucleation cavity 134 extending inward and toward the substrate upper surface 112. More particularly, the phase-change material 140 may expand, thereby deforming the deformable encapsulating layer 130, such that the deformable encapsulating layer 130 forms the at least one peak 136 extending outward and away from the substrate upper surface 112 and at least one nucleation cavity 134 extending inward and toward the substrate upper surface 112. In embodiments, the at least one peak 136 extends outward from the substrate upper surface 112 further than the at least one nucleation cavity 134 in the vertical direction, or in other words, the at least one nucleation cavity 134 extends inward from the at least one peak 136 toward the substrate upper surface 112. For example, in some embodiments, the at least one peak 136 extends outward from the substrate upper surface 112 by a distance evaluated in the vertical direction that is at least twice a distance that the at least one nucleation cavity 134 extends outward from the substrate upper surface 112. In some embodiments, the at least one peak 136 extends outward from the substrate upper surface 112 by a distance evaluated in the vertical direction that is at least five times greater than a distance that the at least one nucleation cavity 134 extends outward from the substrate upper surface 112.

In embodiments, the deformable encapsulating layer 130 is repositionable between a static position, in which the deformable encapsulating layer 130 is oriented to face upward in a vertical direction and is generally smooth, as depicted in FIG. 3, and a dynamic position, in which the deformable encapsulating layer 130 defines the at least one nucleation cavity 134 and the at least one peak 136 as depicted in FIG. 4 as the phase-change material 140 changes phases. As the phase-change material 140 melts, the expansion of the phase-change material 140 is dynamic, such that portions of the deformable encapsulating layer 130 may move upward and downward in the vertical direction. In other words, as the phase-change material 140 changes from the first matter phase (i.e., the solid phase) to the second matter phase (i.e., the liquid phase), particles of the phase-change material 140 move upward and downward in the vertical direction, such that portions of the deformable encapsulating layer 130 dynamically move upward and downward in the vertical direction. For example, the peaks 136 depicted in FIG. 4 may move downward toward the substrate upper surface 112, while the nucleation cavities 134 depicted in FIG. 4 may move upward and away from the substrate upper surface 112.

Figure 5:
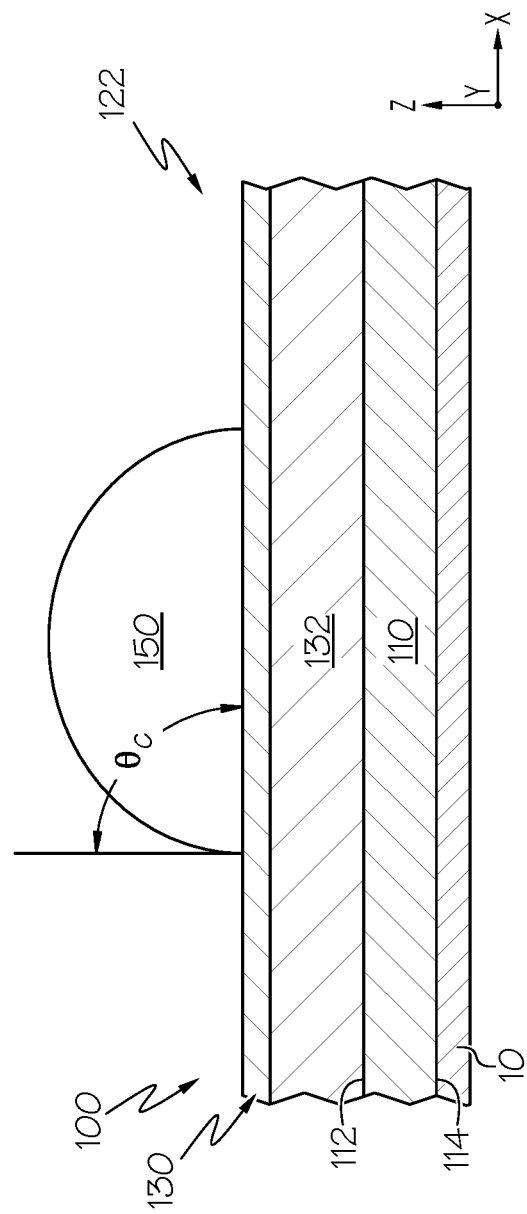
FIG. 5 schematically depicts an enlarged section view of the cooling device of FIG. 2 including a working fluid positioned on the cooling device, according to one or more embodiments shown and described herein.

By dynamically moving the deformable encapsulating layer 130, the phase-change material 140 may change the contact angles at which the working fluid 150 engages the deformable encapsulating layer 130. For example and referring to FIG. 5, an enlarged section view of the cooling device 100 and discrete drop of working fluid 150 is schematically depicted. As shown in FIG. 5, the drop of working fluid 150 contacts the deformable encapsulating layer 130, forming a contact angle at the perimeter of the working fluid 150, depicted as $\theta_c$. As the deformable encapsulating layer 130 moves because of the phase-change material 140 changing from the first matter phase to the second matter phase, the contact angle $\theta_c$ changes, and may form comparatively high contact angles (e.g., 90 degrees or greater). By changing the contact angle $\theta_c$ at which the working fluid 150 engages the deformable encapsulating layer 130 and by assisting in forming comparatively high contact angles, the phase-change material 140 may assist in inducing boiling within the working fluid 150, for example by inducing turbulence in the working fluid 150. Furthermore, by moving the deformable encapsulating layer 130 upward and downward in the vertical direction, the phase-change material 140 may assist in maintaining contact between the deformable encapsulating layer 130 and the working fluid 150. As noted above, by maintaining contact with the working fluid, thermal energy may be transferred from the fin 122 to the working fluid 150, as compared to conventional configurations, in which extended lack of contact with the working fluid 150 from instantaneous or near instantaneous vaporization of the working fluid 150 may reduce the amount of thermal energy transferred from the heat-generating device 10 to the working fluid 150.

Additionally, as the phase-change material 140 melts, thermal energy from the heat-generating device 10 may be dissipated as the the phase-change material 140 changes from the first matter phase (i.e., the solid phase) to the second matter phase (i.e., the liquid phase). In this way, the inclusion of a phase-change material 140 within the fin 122 may further increase the amount of thermal energy from the heat-generating device 10 dissipated by the cooling device 100.

Accordingly, it should now be understood that embodiments described herein are directed to cooling devices engaged with a heat-generating device and including fins positioned on a substrate upper surface. The fins generally include a phase-change material encapsulated on the substrate upper surface by a deformable encapsulating layer. In embodiments, the phase-change material is configured and selected to have a melting point that corresponds to the boiling point of the working fluid engaged with the substrate upper surface. As the phase-change material melts, the phase-change material expands and changes the contour of the deformable encapsulating layer, forming cavities and peaks on the deformable encapsulating layer. By dynamically changing the contour of the deformable encapsulating layer, the phase-change material may assist in maintaining contact with the working fluid as the working fluid boils. Furthermore, the peaks and cavities formed on the deformable encapsulating layer create a variable contact surface with the working fluid, which may assist in inducing boiling within the working fluid and thereby increasing an amount of thermal energy dissipated by the cooling device.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A cooling device comprising:
   a substrate defining a substrate upper surface;
   a deformable encapsulating layer coupled to the substrate upper surface and defining an interior region; and
   a phase-change material encapsulated within the interior region, wherein the phase-change material changes from a first matter phase to a second matter phase at a boiling point of a working fluid positioned on the deformable encapsulating layer.

2. The cooling device of claim 1, wherein the phase-change material has a melting point that is within 5 degrees Celsius of the boiling point of the working fluid.

3. The cooling device of claim 1, wherein the deformable encapsulating layer hermetically seals the phase-change material on the substrate upper surface to form a fin positioned on the substrate upper surface.

4. The cooling device of claim 1, wherein the deformable encapsulating layer comprises a thickness that is less than 100 nanometers.

5. The cooling device of claim 1, wherein the phase-change material comprises a static state thickness that is between 100 micrometers and 500 micrometers.

6. A system comprising:
   a cooling device comprising:
      a substrate defining a substrate upper surface;
      a plurality of fins positioned on the substrate upper surface, each of the plurality of fins comprising:
         a deformable encapsulating layer coupled to the substrate upper surface, wherein the deformable encapsulating layer is repositionable between a static position, in which the deformable encapsulating layer is oriented to face upward in a vertical direction, and a dynamic position, in which the deformable encapsulating layer defines at least one nucleation cavity extending inward and toward the substrate upper surface and at least one peak extending outward and away from the substrate upper surface; and
   a working fluid positioned on the deformable encapsulating layer, wherein the working fluid comprises a boiling point and the deformable encapsulating layer transitions from the static position to the dynamic position at the boiling point of the working fluid.

7. The system of claim 6, wherein the plurality of fins each further comprise a phase-change material positioned on the substrate upper surface and encapsulated by the deformable encapsulating layer, and wherein the phase-change material changes from a first matter phase to a second matter phase at the boiling point of the working fluid.

8. The system of claim 7, wherein the phase-change material comprises a melting point that corresponds to the boiling point of the working fluid.

9. The system of claim 8, wherein the phase-change material has a melting point that is within 5 degrees Celsius of the boiling point of the working fluid.

10. The system of claim 7, wherein the phase-change material comprises a static state thickness that is between 100 micrometers and 500 micrometers.

11. The system of claim 6, wherein the boiling point of the working fluid is less than an operating temperature of a heat-generating device coupled to the cooling device.

12. The system of claim 6, wherein the deformable encapsulating layer comprises a thickness that is less than 100 nanometers.

13. The system of claim 6, wherein the encapsulating layer comprises platinum.

14. A method for cooling a heat-generating device, the method comprising:
   heating a substrate lower surface of a substrate with a heat-generating device;
   transferring thermal energy from the substrate lower surface, through the substrate to a substrate upper surface positioned opposite the substrate lower surface;
   heating an encapsulated phase-change material positioned on the substrate upper surface;
   changing a matter phase of the encapsulated phase-change material;
   heating a working fluid positioned on the encapsulated phase-change material; and
   boiling the working fluid while changing the matter phase of the encapsulated phase-change material.

15. The method of claim 14, wherein changing the matter phase of the encapsulated phase-change material comprises melting the encapsulated phase-change material.

16. The method of claim 15, wherein the encapsulated phase-change material comprises a melting point that is within 5 degrees Celsius of a boiling point of the working fluid.

17. The method of claim 14, wherein a boiling point of the working fluid is less than an operating temperature of the heat-generating device.

18. The method of claim 14, wherein changing the matter phase of the encapsulated phase-change material further comprises elastically deforming a deformable encapsulating layer coupled to the substrate upper surface, the deformable encapsulating layer hermetically sealing the encapsulated phase-change material on the substrate upper surface.

19. The method of claim 18, wherein elastically deforming the deformable encapsulating layer comprises forming at least one nucleation cavity extending inward and toward the substrate upper surface and at least one peak extending outward and away from the substrate upper surface.

20. The method of claim 18, wherein elastically deforming the deformable encapsulating layer comprises changing a contact angle evaluated between the working fluid and the deformable encapsulating layer.

* * * * *